(12) United States Patent
Sun

(10) Patent No.: US 10,459,331 B2
(45) Date of Patent: Oct. 29, 2019

(54) MASK STRUCTURE AND COA TYPE ARRAY SUBSTRATE

(71) Applicant: Wuhan China Star Optoelectronics Technology Co., Ltd., Wuhan (CN)

(72) Inventor: Tao Sun, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 15 days.

(21) Appl. No.: 15/539,701

(22) PCT Filed: Apr. 17, 2017

(86) PCT No.: PCT/CN2017/080735
§ 371 (c)(1),
(2) Date: Jun. 26, 2017

(87) PCT Pub. No.: WO2018/166027
PCT Pub. Date: Sep. 20, 2018

(65) Prior Publication Data
US 2018/0267397 A1 Sep. 20, 2018

(30) Foreign Application Priority Data
Mar. 13, 2017 (CN) .......................... 2017 1 0146792

(51) Int. Cl.
*G03F 1/36* (2012.01)
*G03F 1/00* (2012.01)
(Continued)

(52) U.S. Cl.
CPC .......... *G03F 1/14* (2013.01); *G02F 1/133516* (2013.01); *G02F 1/136227* (2013.01);
(Continued)

(58) Field of Classification Search
CPC ..... G03F 1/32; G03F 1/26; G03F 1/29; G03F 1/36; G03F 1/30; G03F 7/70283;
(Continued)

(56) References Cited

U.S. PATENT DOCUMENTS 6,118,505 A * 9/2000 Nagata .............. G02F 1/136209
349/106
6,977,127 B2* 12/2005 Shiah ........................ G03F 1/30
430/394
(Continued)

FOREIGN PATENT DOCUMENTS

CN        101566790 A       10/2009
CN        103197502 A       7/2013
(Continued)

OTHER PUBLICATIONS

Yu Kan et al., Examiner provided machine translation of CN 104730753 A (Year: 2015).*

*Primary Examiner* — William R Alexander
*Assistant Examiner* — Balram T Parbadia
(74) *Attorney, Agent, or Firm* — Leong C. Lei

(57) ABSTRACT

The present invention provides a mask structure and a COA type array substrate. The mask structure comprises a central light shielding portion (1), a peripheral light shielding portion (3) surrounding the central light shielding portion (1) and conforming to an outer contour shape of the central light shielding portion (1) and a circumambient hollow slit (5) sandwiched between the peripheral light shielding portion (3) and the central light shielding portion (1). The exposure light will diffract through the hollow slit (5) to result in the propagation of the reverse bending and the energy intensity gradient. In conjunction with the negative photoresist, the taper of the finally manufactured color filter layer through hole can be made to be gentle to improve the electrical (Continued)

connection quality between the pixel electrodes and the metal material signal lines for avoiding the display failure.

14 Claims, 6 Drawing Sheets

(51) Int. Cl.
*G02F 1/1362* (2006.01)
*G02F 1/1335* (2006.01)
*G03F 7/00* (2006.01)

(52) U.S. Cl.
CPC .............. *G03F 1/00* (2013.01); *G03F 7/0007* (2013.01); *G02F 2001/136222* (2013.01); *G02F 2201/123* (2013.01)

(58) Field of Classification Search
CPC ......... G02F 1/136227; G02F 2201/123; G02F 1/133345; G02F 1/136286; G02F 2001/136222; G02F 2201/52; H01L 29/78633
See application file for complete search history.

(56) References Cited

U.S. PATENT DOCUMENTS

| | | | |
|---|---|---|---|
| 7,332,250 B2 * | 2/2008 | Misaka | G03F 1/26 430/5 |
| 2003/0203290 A1 * | 10/2003 | Misaka | G03F 1/29 430/5 |
| 2003/0203291 A1 * | 10/2003 | Misaka | G03F 1/29 430/5 |
| 2004/0161678 A1 * | 8/2004 | Misaka | G03F 1/26 430/5 |
| 2006/0274236 A1 * | 12/2006 | Chai | G02F 1/13458 349/111 |
| 2012/0081641 A1 * | 4/2012 | Noh | G02F 1/13394 349/106 |
| 2016/0036005 A1 * | 2/2016 | Qi | H01L 51/5206 257/40 |

FOREIGN PATENT DOCUMENTS

| | | |
|---|---|---|
| CN | 104656333 A | 5/2015 |
| CN | 104730753 A | 6/2015 |
| CN | 104977813 A | 10/2015 |

* cited by examiner

MASK STRUCTURE AND COA TYPE ARRAY SUBSTRATE

FIELD OF THE INVENTION

The present invention relates to a liquid crystal display process field, and more particularly to a mask structure and a COA type array substrate.

BACKGROUND OF THE INVENTION

As the constant development of the display technology, the Thin Film Transistor Liquid Crystal Display (TFT-LCD) is widely used in mobile phones, televisions, personal digital assistants, digital cameras, notebook computers, desktop computers and other consumer electronics products because of its high quality, power saving, thin body, small size and no radiation, and becomes the mainstream in the flat panel display device.

Most of the liquid crystal displays on the present market are backlight type liquid crystal displays, which comprise a liquid crystal display panel and a backlight module. The conventional liquid crystal display panel comprises a Color Filter (CF), a Thin Film Transistor Array Substrate (TFT Array Substrate) and a Liquid Crystal Layer positioned between the two substrates. The working principle is that the light of backlight module is reflected to generate images by applying driving voltages to the two substrates for controlling the rotations of the liquid crystal molecules.

At present, in order to improve the aperture of the LCD display panel and to reduce the parasitic capacitance effect, more and more liquid crystal display panel products integrates the color filter on the side of the array substrate, i.e. utilizing the COA (Color Filter On Array) technology. The COA type array substrate does not need to take into account the deviation of the cell process as being compared to setting the color filter and the black matrix on the color filter substrate according to prior art. It can appropriately reduce the width of the black matrix by ensuring that the black matrix can shield the structure, which needs light shielding, such as the gate lines, the data lines and the thin film transistor units, thereby increasing the aperture ratio.

As shown in FIG. 1, in the COA type array substrate, a protective layer 100, a color filter layer 200, pixel electrodes 300 and a black matrix (not shown) are stacked on the array of the thin film transistors T10 in order, and through holes 201 are formed on the color filter layer 200 to achieve the electrical connection between the pixel electrodes 300 and the metal material signal lines. In the actual production process, the through holes 201 in the color filter layer 200 are formed by using a pattern of a mask with a negative photoresist. The characteristic of the negative photoresist is that the area where the light is irradiated is not removed by the developer, and the area not irradiated by the light will be removed by the developer, which is opposite to the characteristic of the positive photoresist.

As shown in FIG. 2, the conventional pattern of the mask for forming the through holes 201 in the color filter layer 200 is a solid circular light shielding region 900 and a hollow light transmission region 901 outside the light shielding region 900. The solid circular light shielding region 900 corresponds to the position of the through hole 201 in the color filter layer 200. However, as shown in FIG. 3, the use of the conventional mask to produce the through hole 201 in the color filter layer 200 causes the thickness and the gradient of the color filter layer 200 at the through hole 201 to be less easily controlled and the taper is steep, which can easily cause the pixel electrode 300 in the through hole 201 to break to result in the poor electrical connection between the pixel electrodes 300 and the metal material signal lines and then, the display failure. To ensure the good electrical connection requires the production of larger through holes 201, which will undoubtedly reduce the pixel aperture ratio. Moreover, the condition of too large through hole 201 can easily lead to the gas leakage due to vibration after the cell process and may spread to the liquid crystal layer, resulting in bubble and the formation of black groups to affect the display effect.

SUMMARY OF THE INVENTION

An objective of the present invention is to provide a mask structure, which can make a taper of the color filter layer through hole be gentle to improve the electrical connection quality between the pixel electrodes and the metal material signal lines for avoiding the display failure.

Another objective of the present invention is to provide a COA type array substrate, of which a taper of color filter layer through holes is gentle to improve the electrical connection quality between the pixel electrodes and the metal material signal lines for avoiding the display failure.

For realizing the aforesaid objectives, the present invention provides a mask structure, comprising a central light shielding portion, a peripheral light shielding portion surrounding the central light shielding portion and conforming to an outer contour shape of the central light shielding portion and a circumambient hollow slit sandwiched between the peripheral light shielding portion and the central light shielding portion.

Selectably, the outer contour shape of the central light shielding portion is an annular shape, and the peripheral light shielding portion is correspondingly an annular ring shape, and the hollow slit is correspondingly an annular ring shape.

Selectably, the outer contour shape of the central light shielding portion is a square, and the peripheral light shielding portion is correspondingly a circumambient square ring shape, and the hollow slit is correspondingly a circumambient square ring shape.

Selectably, the outer contour shape of the central light shielding portion is a regular hexagon, and the peripheral light shielding portion is correspondingly a circumambient regular hexagon ring shape, and the hollow slit is correspondingly a circumambient regular hexagon ring shape.

Selectably, the outer contour shape of the central light shielding portion is a regular octagon, and the peripheral light shielding portion is correspondingly a circumambient regular octagon ring shape, and the hollow slit is correspondingly a circumambient regular octagon ring shape.

A width of the hollow slit is less than or equal to 2.0 μm.

A width of the peripheral light shielding portion is larger than 0.5 μm and less than or equal to 1.0 μm.

A material of the central light shielding portion and the peripheral light shielding portion is chromium.

The present invention further provides a COA type array substrate, comprising thin film transistors arranged in array, and a protective layer, a color filter layer, pixel electrodes and a black matrix stacked on the thin film transistors from bottom to top in order; through holes are formed on the color filter layer, and the pixel electrodes are connected with drains of the thin film transistors via the through holes;

the through holes being manufactured by a mask having the aforesaid mask structure, and a taper thereof being gentle to improve the electrical connection quality between the pixel electrodes and the metal material signal lines for avoiding the display failure.

The present invention further provides a mask structure, comprising a central light shielding portion, a peripheral light shielding portion surrounding the central light shielding portion and conforming to an outer contour shape of the central light shielding portion and a circumambient hollow slit sandwiched between the peripheral light shielding portion and the central light shielding portion;

wherein a width of the hollow slit is less than or equal to 2.0 μm;

wherein a material of the central light shielding portion and the peripheral light shielding portion is chromium.

The benefits of the present invention are: the present invention provides a mask structure, and a circumambient hollow slit is sandwiched between the peripheral light shielding portion and the central light shielding portion. The exposure light will diffract through the hollow slit to result in the propagation of the reverse bending and the energy intensity gradient. In conjunction with the negative photoresist, the taper of the finally manufactured color filter layer through hole can be made to be gentle to improve the electrical connection quality between the pixel electrodes and the metal material signal lines for avoiding the display failure. The present invention provides a COA type array substrate, of which the color filter layer through holes is manufactured by a mask having the aforesaid mask structure, and a taper thereof is gentle to improve the electrical connection quality between the pixel electrodes and the metal material signal lines for avoiding the display failure.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Please refer to FIG. 4 to FIG. 7, together. The present invention provides a mask structure, used for manufacturing a color filter layer through hole in the COA type array substrate. The mask structure comprises a central light shielding portion 1, a peripheral light shielding portion 3 surrounding the central light shielding portion 1 and conforming to an outer contour shape of the central light shielding portion 1 and a circumambient hollow slit 5 sandwiched between the peripheral light shielding portion 3 and the central light shielding portion 1.

The mask of the present invention is used in conjunction with a negative photoresist. The pattern formed by the central light shielding portion 1, the hollow slit 5 and the peripheral light shielding portion 3 corresponds to the position of the finally manufactured color filter layer through hole.

Figure 1:
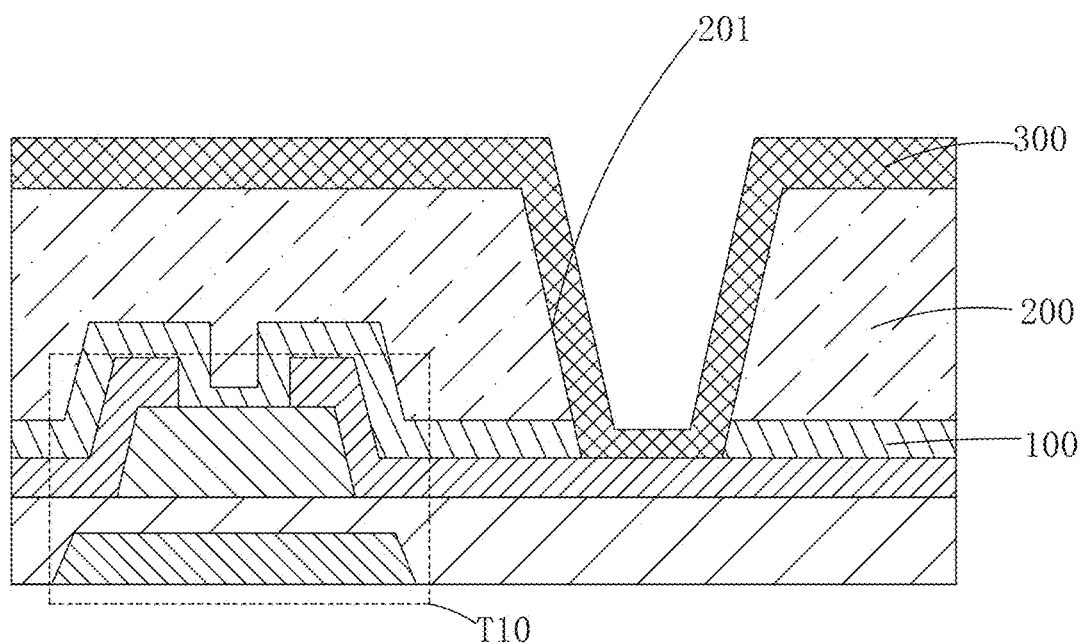
FIG. 1 is a sectional structure diagram of a COA type array substrate according to prior art.
Figure 2:
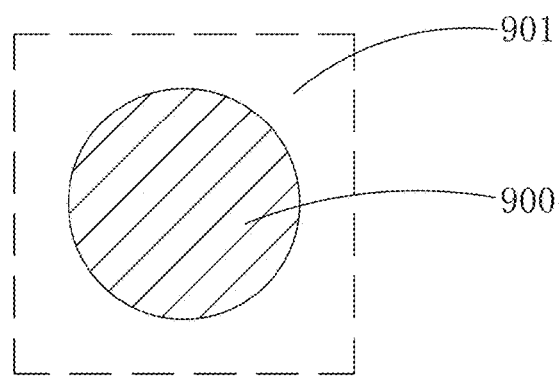
FIG. 2 is a diagram of a pattern used by a mask of manufacturing a color filter layer through hole according to prior art.
Figure 3:
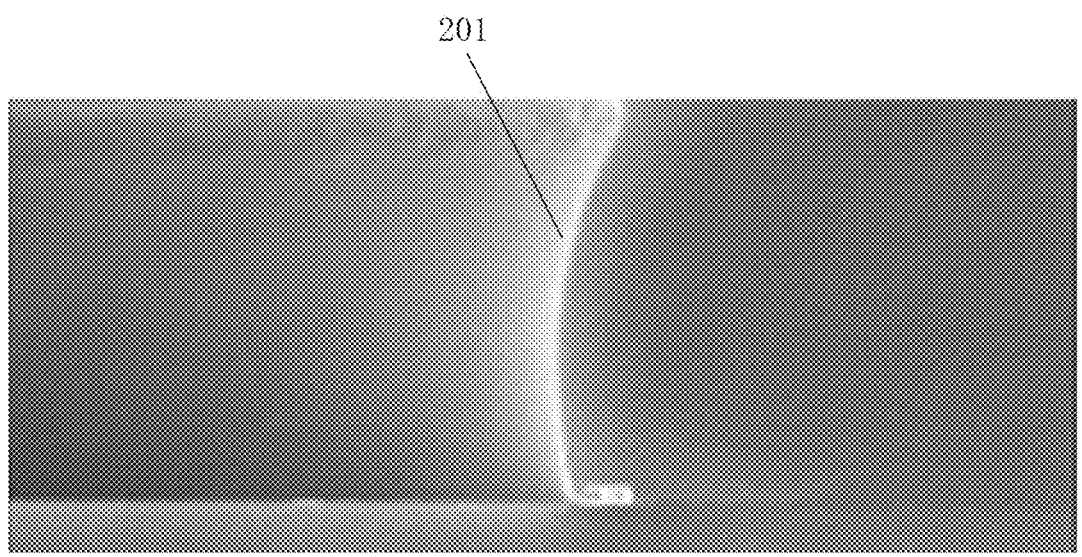
FIG. 3 is a diagram of resulting in a steep taper of the through hole as manufacturing the color filter layer through hole according to prior art.
Figure 8:
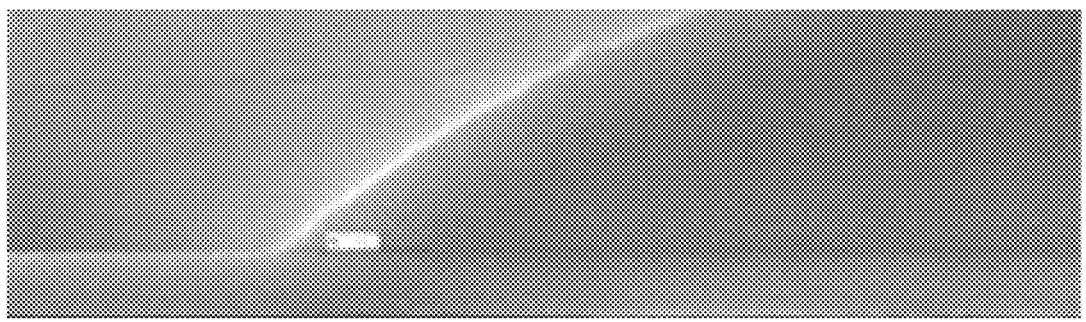
FIG. 8 is a diagram of resulting in a gentle taper of the through hole as manufacturing the color filter layer through hole by using the mask having the mask structure according to the present invention.

According to the principle of light diffraction, the light through the obstacles, such as the slit or the hole will occur in bending spread of various degrees. There are bright and dark stripes diffraction pattern and the borders of light and dark stripes are not sharp for showing a bright and dark state. Meanwhile, the energy intensity of light will also change. A circumambient hollow slit 5 is sandwiched between the peripheral light shielding portion 3 and the central light shielding portion 1 in the present invention. The exposure light will diffract through the hollow slit 5 to result in the propagation of the reverse bending and the energy intensity gradient rather than traveling along a straight line as it passed through the mask according to prior art shown in FIG. 2; after exposure, the area not exposed to light is removed by the developer and the area exposed to light will not be removed by the developer, the taper of the finally manufactured color filter layer through hole becomes gentle as shown in FIG. 8 to improve the electrical connection quality between the pixel electrodes and the metal material signal lines for avoiding the display failure.

Specifically, a material of the central light shielding portion 1 and the peripheral light shielding portion 3 is chromium (Cr).

Figure 4:
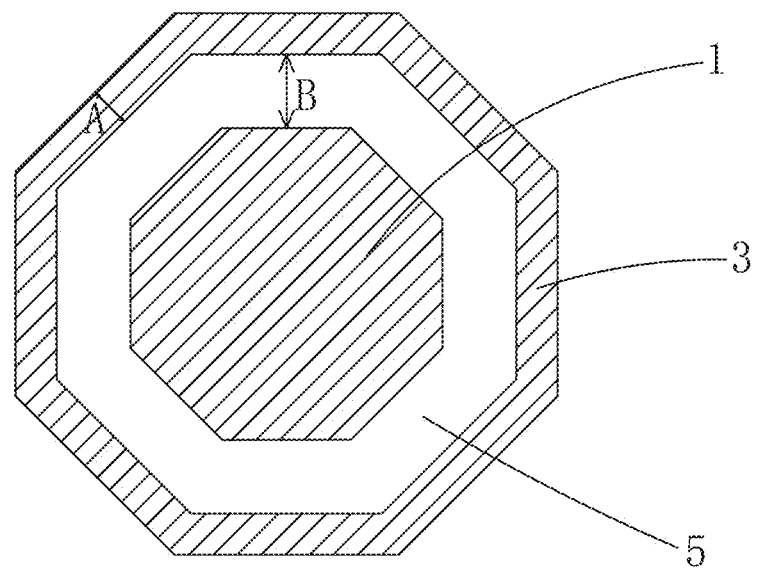
FIG. 4 is a diagram of the first embodiment of the mask structure according to the present invention.

FIG. 4 shows the first embodiment of the mask structure according to the present invention. In the first embodiment, the outer contour shape of the central light shielding portion 1 is a regular octagon, and the peripheral light shielding portion 3 is correspondingly a circumambient regular octagon ring shape, and the hollow slit 5 is correspondingly a circumambient regular octagon ring shape.

The vertical distance of the outer contour of the central light shielding portion 1 to an inner contour of the peripheral light shielding portion 3 is defined as a width of the hollow slit 5. The width of the hollow slit 5 is denoted as B, and the optimum value of B is:

$$B \leq 2.0 \ \mu m$$

As B>2.0, the photoresist residue will appear within the color filter layer through hole to cause the etching residue and to affect the diffraction effect of the exposure light.

The vertical distance between the inner contour and the outer contour of the peripheral light shielding portion 3 is defined as a width of the peripheral light shielding portion 3.

The width of the peripheral light shielding portion 3 is denoted as A, and the optimum value of A is:

0.5 µm<A≤1.0 µm

The taper of the finally manufactured color filter layer through hole is significantly improved when the width A of the peripheral light shielding portion 3 is in the optimum value range; and as A≤0.5 µm, the taper of the finally manufactured color filter layer through hole is close to be vertical, and the diffraction effect cannot be revealed.

The size of the central light shielding portion 1 can be determined according to the specific sizes of the different color filter layer through holes.

Figure 5:
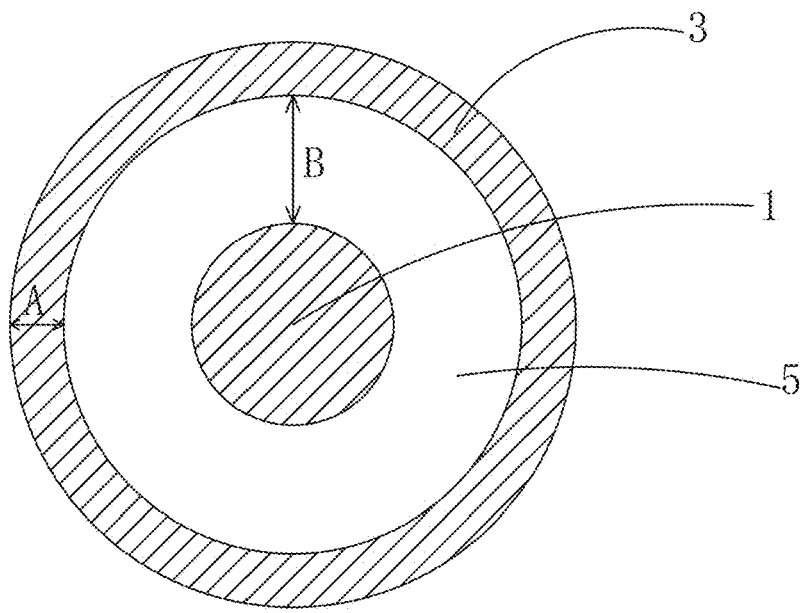
FIG. 5 is a diagram of the second embodiment of the mask structure according to the present invention.

FIG. 5 shows the second embodiment of the mask structure according to the present invention. In the second embodiment, the outer contour shape of the central light shielding portion 1 is an annular shape, and the peripheral light shielding portion 3 is correspondingly an annular ring shape, and the hollow slit 5 is correspondingly an annular ring shape. The width A of the peripheral light shielding portion 3 and the width B of the hollow slit 5 are the same as those of the first embodiment. The description is not repeated here.

Figure 6:
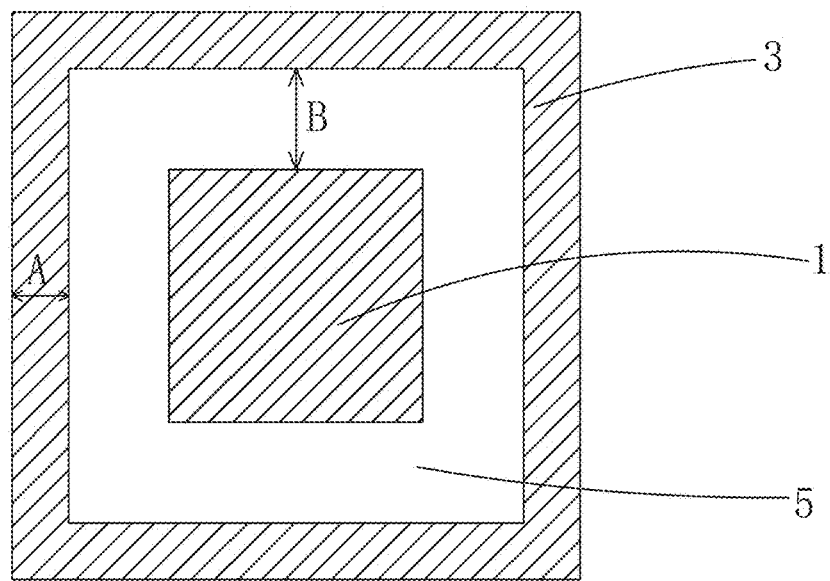
FIG. 6 is a diagram of the third embodiment of the mask structure according to the present invention.

FIG. 6 shows the third embodiment of the mask structure according to the present invention. In the third embodiment, the outer contour shape of the central light shielding portion 1 is a square, and the peripheral light shielding portion 3 is correspondingly a circumambient square ring shape, and the hollow slit 5 is correspondingly a circumambient square ring shape. The width A of the peripheral light shielding portion 3 and the width B of the hollow slit 5 are the same as those of the first embodiment. The description is not repeated here.

Figure 7:
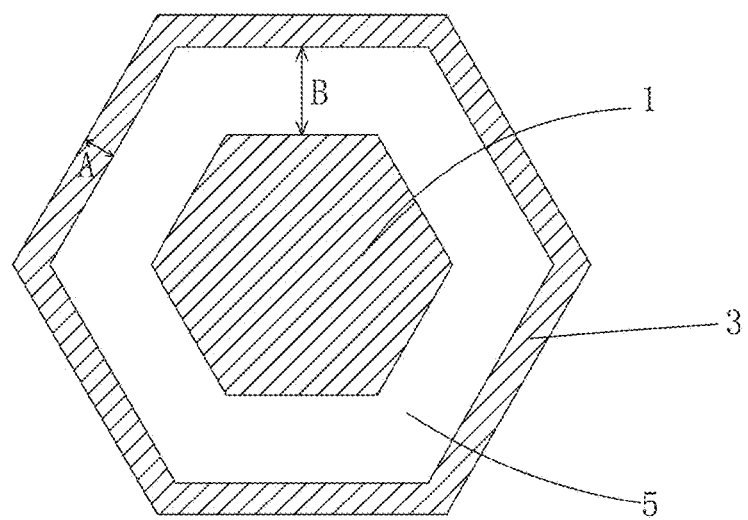
FIG. 7 is a diagram of the fourth embodiment of the mask structure according to the present invention.

FIG. 7 shows the fourth embodiment of the mask structure according to the present invention. In the fourth embodiment, the outer contour shape of the central light shielding portion 1 is a regular hexagon, and the peripheral light shielding portion 3 is correspondingly a circumambient regular hexagon ring shape, and the hollow slit 5 is correspondingly a circumambient regular hexagon ring shape. The width A of the peripheral light shielding portion 3 and the width B of the hollow slit 5 are the same as those of the first embodiment. The description is not repeated here.

Of course, the mask structure of the present invention is not limited to the above four embodiments. The central light shielding portion 1 may also have a regular polygonal shape having a different number of sides, such as a regular pentagon, a regular heptagon or a regular decagon, and the peripheral light shielding portion 3 and the hollow slit 5 are correspondingly circumambient regular polygonal ring shape, which is related to the accuracies of the exposure equipment and the etching equipment. If the accuracies of the exposure equipment and the etching equipment are higher, the regular polygonal shape with fewer sides can be selected. On the contrary, if the accuracies of the exposure equipment and the etching equipment are lower, the regular polygonal shape with more sides can be selected.

Figure 9:
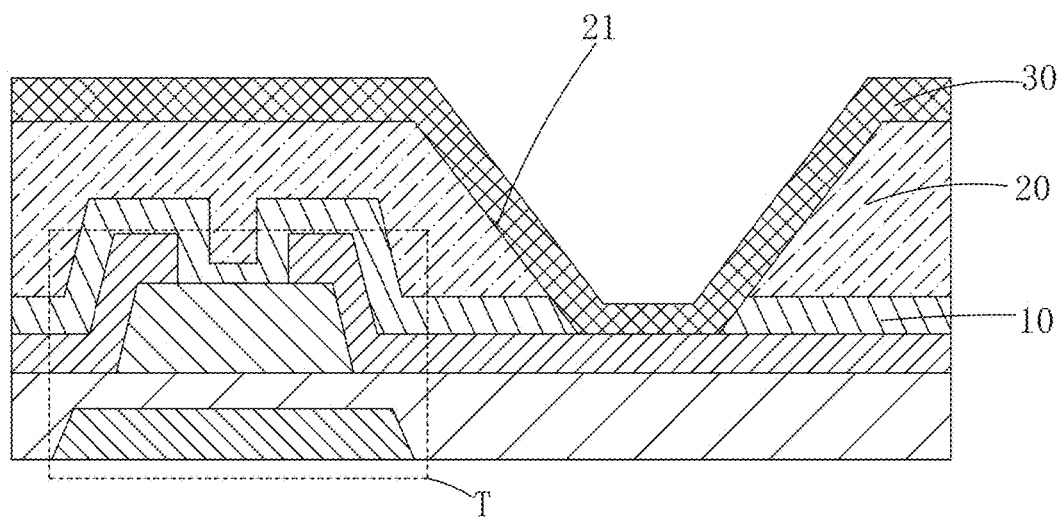
FIG. 9 is a sectional structure diagram of a COA type array substrate according to the present invention.

Please refer to FIG. 9. The present invention further provides a COA type array substrate, comprising thin film transistors T arranged in array, and a protective layer 10, a color filter layer 20, pixel electrodes 30 and a black matrix (not shown) stacked on the thin film transistors T from bottom to top in order. Through holes 21 are formed on the color filter layer 20, and the pixel electrodes 30 are connected with drains of the thin film transistors T via the through holes 21.

The through holes 21 are manufactured by a mask having the aforesaid mask structure, and a taper thereof is gentle. Thus, the pixel electrodes 30 in the through holes 21 are not easily broken to improve the electrical connection quality with the metal material signal lines for avoiding the display failure.

In conclusion, in the mask structure of the present invention, a circumambient hollow slit is sandwiched between the peripheral light shielding portion and the central light shielding portion. The exposure light will diffract through the hollow slit to result in the propagation of the reverse bending and the energy intensity gradient. In conjunction with the negative photoresist, the taper of the finally manufactured color filter layer through hole can be made to be gentle to improve the electrical connection quality between the pixel electrodes and the metal material signal lines for avoiding the display failure. In the COA type array substrate of the present invention, the color filter layer through holes is manufactured by a mask having the aforesaid mask structure, and a taper thereof is gentle to improve the electrical connection quality between the pixel electrodes and the metal material signal lines for avoiding the display failure.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A mask structure of a mask for manufacturing a color filter layer through hole, comprising a central light shielding portion, a peripheral light shielding portion surrounding the central light shielding portion and conforming to an outer contour shape of the central light shielding portion and a single circumambient hollow slit sandwiched between the peripheral light shielding portion and the central light shielding portion, wherein a width of the circumambient hollow slit is less than or equal to 2.0 µm to diffract exposure light through the circumambient hollow slit to result in propagation of reverse bending and energy intensity gradient to gentle a taper of the color filter layer through hole;

wherein the single circumambient hollow slit circumferentially surrounds the central light shielding portion such that the exposure light passing through the single circumambient hollow slit causes exposure at a first location corresponding to the single circumambient hollow slit and also causes exposure at a second location corresponding to the central light shielding portion, exposure of the first and second portions allowing the color filter layer through hole to be formed through exposure to light passing through only the single circumambient hollow slit.

2. The mask structure according to claim 1, wherein the outer contour shape of the central light shielding portion is an annular shape, and the peripheral light shielding portion is correspondingly an annular ring shape, and the hollow slit is correspondingly an annular ring shape.

3. The mask structure according to claim 1, wherein the outer contour shape of the central light shielding portion is a square, and the peripheral light shielding portion is correspondingly a circumambient square ring shape, and the hollow slit is correspondingly a circumambient square ring shape.

4. The mask structure according to claim 1, wherein the outer contour shape of the central light shielding portion is a regular hexagon, and the peripheral light shielding portion is correspondingly a circumambient regular hexagon ring shape, and the hollow slit is correspondingly a circumambient regular hexagon ring shape.

5. The mask structure according to claim 1, wherein the outer contour shape of the central light shielding portion is a regular octagon, and the peripheral light shielding portion is correspondingly a circumambient regular octagon ring shape, and the hollow slit is correspondingly a circumambient regular octagon ring shape.

6. The mask structure according to claim 1, wherein a width of the peripheral light shielding portion is larger than 0.5 μm and less than or equal to 1.0 μm.

7. The mask structure according to claim 1, wherein a material of the central light shielding portion and the peripheral light shielding portion is chromium.

8. A color-filter-on-array (COA) type array substrate, comprising thin film transistors arranged in array, and a protective layer, a color filter layer, pixel electrodes and a black matrix stacked on the thin film transistors from bottom to top in order, wherein the color filter layer through holes are formed in the color filter layer, and the pixel electrodes are connected with drains of the thin film transistors via the color filter layer through holes;

the color filter layer through holes being manufactured by the mask having the mask structure according to claim 1, and the taper of the color filter layer through hole being gentle.

9. A mask structure of a mask for manufacturing a color filter layer through hole, comprising a central light shielding portion, a peripheral light shielding portion surrounding the central light shielding portion and conforming to an outer contour shape of the central light shielding portion and a circumambient hollow slit sandwiched between the peripheral light shielding portion and the central light shielding portion;

wherein a width of the circumambient hollow slit is less than or equal to 2.0 μm to diffract exposure light through the circumambient hollow slit to result in propagation of reverse bending and energy intensity gradient to gentle a taper of the color filter layer through hole;

wherein the single circumambient hollow slit circumferentially surrounds the central light shielding portion such that the exposure light passing through the single circumambient hollow slit causes exposure at a first location corresponding to the single circumambient hollow slit and also causes exposure at a second location corresponding to the central light shielding portion, exposure of the first and second portions allowing the color filter layer through hole to be formed through exposure to light passing through only the single circumambient hollow slit; and wherein a material of the central light shielding portion and the peripheral light shielding portion is chromium.

10. The mask structure according to claim 9, wherein the outer contour shape of the central light shielding portion is an annular shape, and the peripheral light shielding portion is correspondingly an annular ring shape, and the hollow slit is correspondingly an annular ring shape.

11. The mask structure according to claim 9, wherein the outer contour shape of the central light shielding portion is a square, and the peripheral light shielding portion is correspondingly a circumambient square ring shape, and the hollow slit is correspondingly a circumambient square ring shape.

12. The mask structure according to claim 9, wherein the outer contour shape of the central light shielding portion is a regular hexagon, and the peripheral light shielding portion is correspondingly a circumambient regular hexagon ring shape, and the hollow slit is correspondingly a circumambient regular hexagon ring shape.

13. The mask structure according to claim 9, wherein the outer contour shape of the central light shielding portion is a regular octagon, and the peripheral light shielding portion is correspondingly a circumambient regular octagon ring shape, and the hollow slit is correspondingly a circumambient regular octagon ring shape.

14. The mask structure according to claim 9, wherein a width of the peripheral light shielding portion is larger than 0.5 μm and less than or equal to 1.0 μm.

* * * * *